US011456162B2

(12) United States Patent
Harkness, IV et al.

(10) Patent No.: US 11,456,162 B2
(45) Date of Patent: Sep. 27, 2022

(54) MULTIFOCAL MAGNETRON DESIGN FOR PHYSICAL VAPOR DEPOSITION PROCESSING ON A SINGLE CATHODE

(71) Applicant: HIA, Inc., Livermore, CA (US)

(72) Inventors: Samuel D. Harkness, IV, Albany, CA (US); Quang N. Tran, San Jose, CA (US)

(73) Assignee: HIA, Inc., Livermore, CA (US)

( * ) Notice: Subject to any disclaimer, the term of this patent is extended or adjusted under 35 U.S.C. 154(b) by 374 days.

(21) Appl. No.: 16/210,488

(22) Filed: Dec. 5, 2018

(65) Prior Publication Data

US 2019/0180991 A1    Jun. 13, 2019

Related U.S. Application Data

(60) Provisional application No. 62/598,383, filed on Dec. 13, 2017.

(51) Int. Cl.
*H01J 37/34* (2006.01)
*C23C 14/35* (2006.01)
*C23C 14/34* (2006.01)

(52) U.S. Cl.
CPC ........ *H01J 37/345* (2013.01); *C23C 14/3407* (2013.01); *C23C 14/35* (2013.01);
(Continued)

(58) Field of Classification Search
CPC ............... H01J 37/3414; H01J 37/3452; H01J 37/3405; H01J 37/3408; H01J 37/345;
(Continued)

(56) References Cited

U.S. PATENT DOCUMENTS 4,597,847 A * 7/1986 Boys .................... H01J 37/3458
                                                       204/192.12
4,747,926 A * 5/1988 Shimizu .............. H01J 37/3408
                                                       204/298.18
(Continued)

FOREIGN PATENT DOCUMENTS

JP    2014237866 A  * 12/2014
KR    2005018716 A  *  8/2003  .......... H01J 37/3405

OTHER PUBLICATIONS

DERWENT Abstract KR 2005018716 A (Year: 2003).*
(Continued)

*Primary Examiner* — Michael A Band
(74) *Attorney, Agent, or Firm* — Cooley LLP

(57) ABSTRACT

An apparatus has a cathode target with a cathode target outer perimeter. An inner magnet array with an inner magnet array inner perimeter is within the cathode target outer perimeter. The inner magnet array includes an inner magnet array base portion and an inner magnet array upper portion. A keeper plate assembly is connected to the inner magnet array upper portion and isolates the inner magnet array upper portion from the inner magnet array base portion. An outer magnet array is connected to a bottom surface of the keeper plate. The outer magnet array has an outer magnet array outer perimeter larger than the inner magnet array inner perimeter. The inner magnet array upper portion has a first magnetic orientation and the outer magnet array and the inner magnet array base portion have a second magnetic orientation opposite the first magnetic orientation.

2 Claims, 9 Drawing Sheets

(52) U.S. Cl.
CPC ........ *C23C 14/355* (2013.01); *H01J 37/3405* (2013.01); *H01J 37/3414* (2013.01); *H01J 37/3435* (2013.01); *H01J 37/3452* (2013.01); *H01J 37/3461* (2013.01)

(58) Field of Classification Search
CPC ............... H01J 37/3461; H01J 37/3458; H01J 37/3435; C23C 14/355; C23C 14/35; C23C 14/3407
See application file for complete search history.

(56) References Cited

U.S. PATENT DOCUMENTS

| | | | |
|---|---|---|---|
| 5,417,833 A | 5/1995 | Harra et al. | |
| 8,016,982 B2* | 9/2011 | Yamamoto | H01J 37/3452 204/192.1 |
| 2009/0314631 A1 | 12/2009 | Bernick et al. | |
| 2010/0230282 A1 | 9/2010 | Kondo et al. | |
| 2013/0299349 A1 | 11/2013 | Kuriyama et al. | |

OTHER PUBLICATIONS

Machine Translation KR 2005018716 A (Year: 2003).*
Machine Translation JP 2014237866 A (Year: 2014).*
International Search Report dated Mar. 21, 2019, for PCT Application No. PCT/US2018/065212, filed on Dec. 12, 2018, 2 pages.
Written Opinion of the International Searching Authority dated Mar. 21, 2019, for PCT Application No. PCT/US2018/065212, filed on Dec. 12, 2018, 12 pages.

* cited by examiner

MULTIFOCAL MAGNETRON DESIGN FOR PHYSICAL VAPOR DEPOSITION PROCESSING ON A SINGLE CATHODE

CROSS-REFERENCE TO RELATED APPLICATION

This application claims priority to U.S. Provisional Patent Application Ser. No. 62/598,383, tiled Dec. 13, 2017, the contents of which are incorporated herein by reference.

FIELD OF THE INVENTION

This invention relates generally to material processing. More particularly, this invention relates to an apparatus for physical vapor deposition sputter processing of thin film materials.

BACKGROUND OF THE INVENTION

Sputter processing has been the preferred mode of operation for many thin film deposition processes owing to its cost effectiveness and ease in process design. To make most use of the technology, magnetrons have been employed which enable effective confinement of electron plasmas near the target cathode at low operating pressures (<10 mTorr). This is accomplished by placing a magnet or magnet array of one polarity and surrounding it with a magnet of the opposite polarity. In so doing, magnetic field lines traverse through space from one magnet to the other. Torque is provided to electrons as they orbit the changing vector of the connecting fields, which is found maximum at that point when the field is orthogonal to the original direction of travel (zero-crossing). With this amount of torque, the orbiting electron reaches a zenith in quantum mechanical cross-section and is optimized to ionize proximal vapor species.

FIG. 1A illustrates two annular magnet arrays 40 and 42 connected to a permeable keeper plate 41. The device as integrated is shown in perspective in FIG. 1B. Similarly, in FIG. 2A a single center magnet 102 is surrounded by an oppositely polarized magnet 101 and both are connected to a keeper plate 100. The device is shown in perspective in FIG. 2B.

One limitation of these magnetrons as described is that the outer magnet (e.g., 40 or 101) will necessarily form a fringing field allowing the balance of the flux not absorbed by the inner magnet (e.g., 42 or 102) to close back to the other pole. This fringing field causes the divergence of fast electrons (i.e., those of ionizing energies) away from the desired confinement zone within which ionization would lead to impact sputtering. This is shown graphically in FIG. 1A. The divergence is represented by the dashed line (43) which indicate where the zero-crossing may be found as one traverses spatially above the magnetron surface. Furthermore, when a plurality of other such devices are brought into proximity of each other, the electron dynamics cause increasing levels of interference to stable operation of the individual sputter plasmas.

SUMMARY OF THE INVENTION

An apparatus has a cathode target with a cathode target outer perimeter. An inner magnet array with an inner magnet array inner perimeter is within the cathode target outer perimeter. The inner magnet array includes an inner magnet array base portion and an inner magnet array upper portion. A keeper plate assembly is connected to the inner magnet array upper portion and isolates the inner magnet array upper portion from the inner magnet array base portion. An outer magnet array is connected to a bottom, surface of the keeper plate. The outer magnet array has an outer magnet array outer perimeter larger than the inner magnet array inner perimeter. The inner magnet array upper portion has a first magnetic orientation and the outer magnet array and the inner magnet array base portion have a second magnetic orientation opposite the first magnetic orientation.

An apparatus has a keeper plate with a keeper plate outer perimeter. An annular magnet array has an annular magnet array outer perimeter coincident with the keeper plater outer perimeter. An inner top magnet is positioned on a centerline of a first side of the keeper plate and an inner bottom magnet is positioned on the centerline of a second side of the keeper plate. The inner top magnet is of a first magnetic orientation and the annular magnet array and the inner bottom magnet have a second magnetic orientation opposite the first magnetic orientation to form a magnetic field environment that provides plasma confinement of ionizing electrons which causes a gas operative as a reactive gas and sputter gas to become ionized and subsequently be directed to a target cathode while simultaneously causing the ionization of sputtered species which are dispersed across a substrate.

BRIEF DESCRIPTION OF THE FIGURES

The invention is more fully appreciated in connection with the following detailed description taken in conjunction with the accompanying drawings, in which.

DESCRIPTION OF THE INVENTION

Figure 1B:
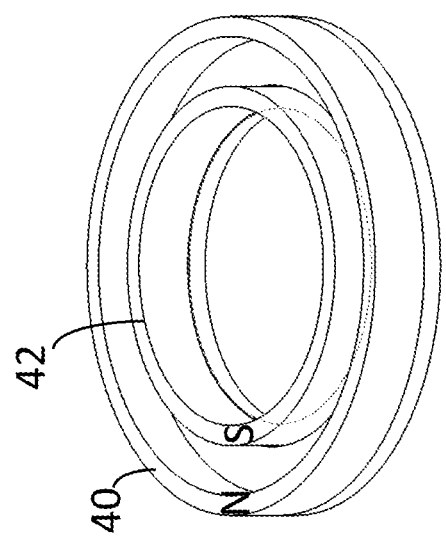
FIG. 1B is a perspective drawing of the same fully integrated part of FIG. 1A.
Figure 1A:
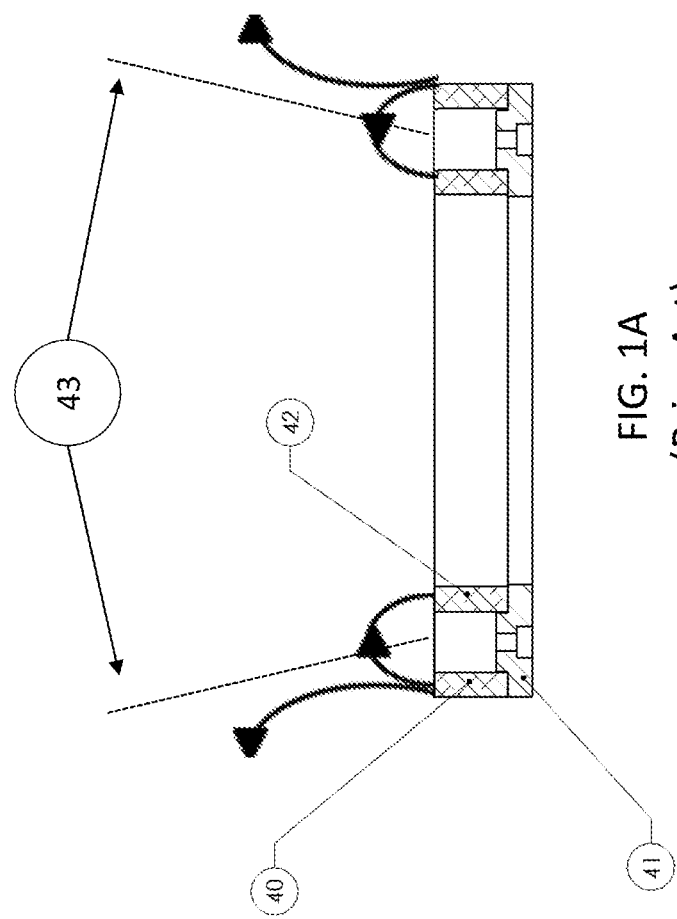
FIG. 1A is a cross section of a simple magnetron magnet pack with oppositely polarized magnets mounted concentrically atop a keeper plate 41.
Figure 2B:
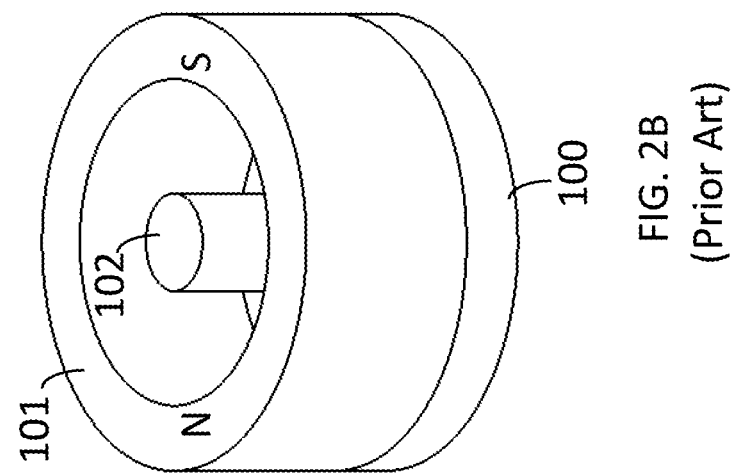
FIG. 2B is a perspective view of the device of FIG. 2A.
Figure 2A:
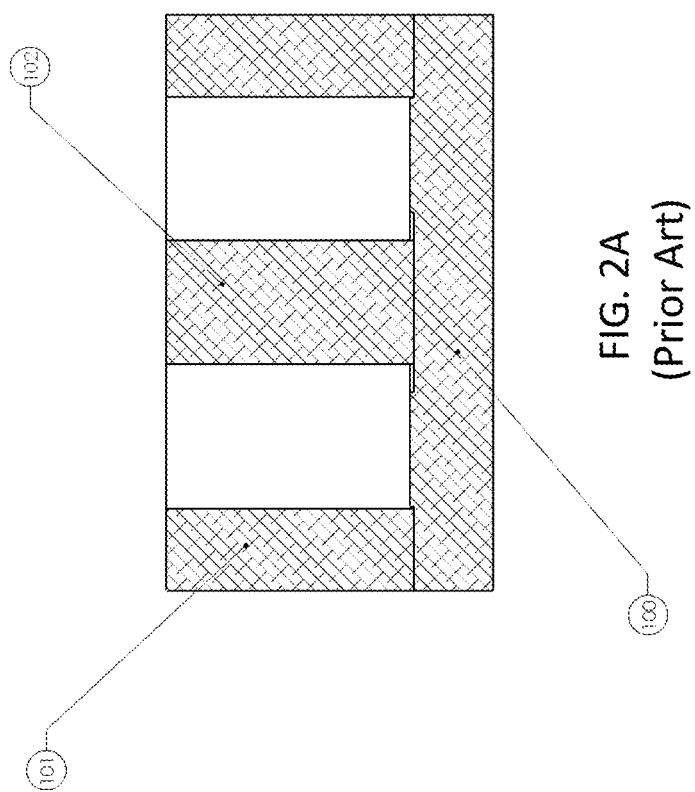
FIG. 2A is a cross section of a simple magnetron magnet pack with a center magnet 102 surrounded by an oppositely polarized magnet 101. Both magnets are connected to a keeper plate 100.
Figure 3A:
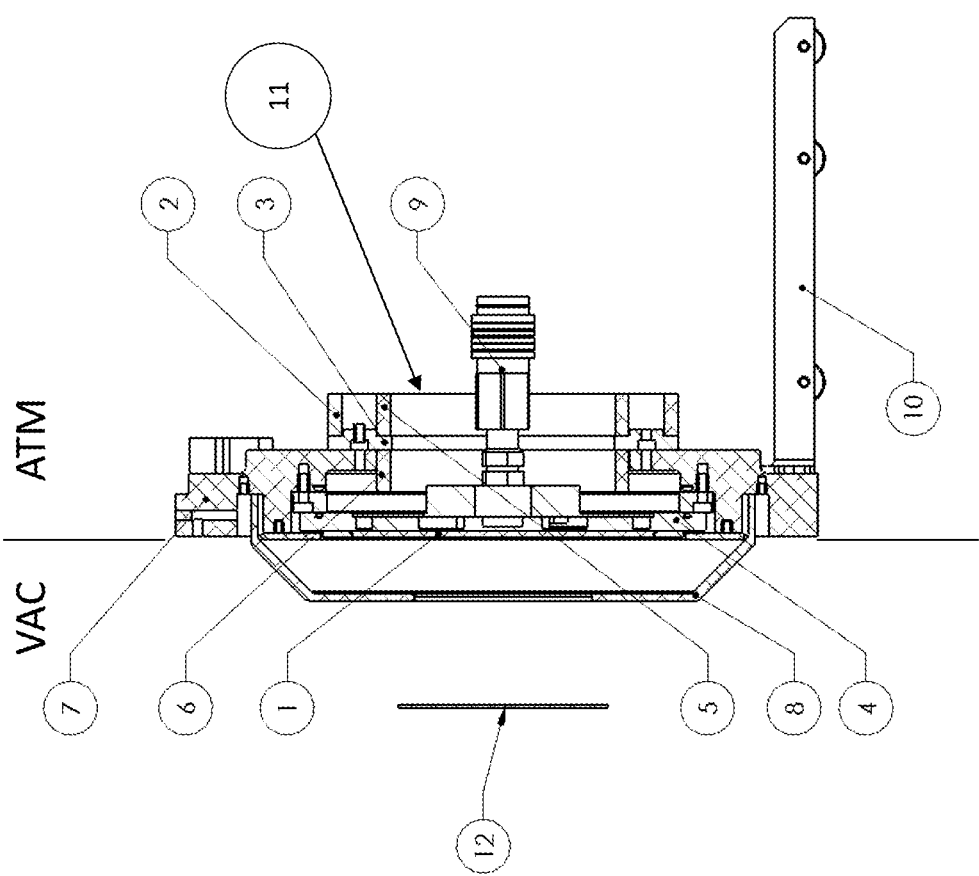
FIG. 3A is a detailed drawing in cross section of the new magnet pack assembly 11 incorporated into a functional magnetron structure.

FIG. 3A illustrates a magnet pack 11 constructed in such a way that the magnetic field is propagated primarily from the inner portion of the magnet pack to the outer edge of the magnet pack. Furthermore, the projection of resultant zero-crossings of the magnetic field lines (i.e., where the field is directly parallel to the magnet emanating surface 6 as well as parallel with the cathode surface 1 are observed to be collinear with the axis normal of cathode or are found increasingly toward centerline of the magnet pack 11.

Figure 4A:
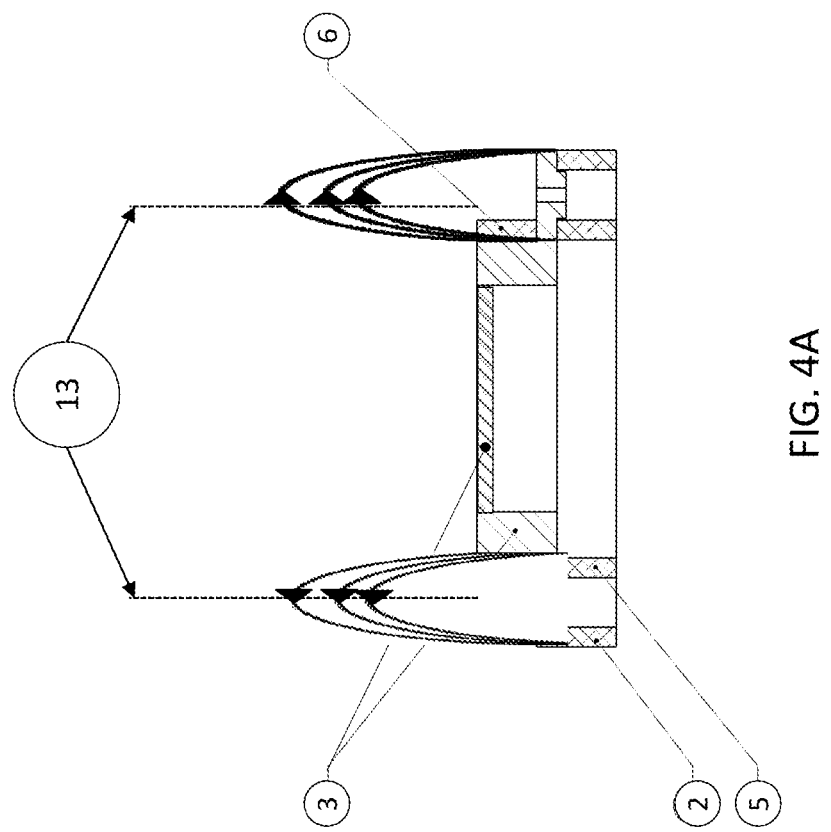
FIG. 4A is a cross sectional view of the novel magnet pack showing the arrangement of magnet arrays and the resultant field vectors and projection of zero-crossings.

This is shown in FIG. 4A. The projection of zero-crossings in this figure are shown as 13. Returning to FIG. 3A, the magnets comprising the magnet pack 11 are situated such that the inner array is mounted on top of a permeable keeper plate assembly 3 ($\mu/\mu_o$~1000) and positioned directly beneath a cathode structure which is comprised of a slab of target material 1 from which the deposition will be derived. The cathode target 1 is affixed to a heat-sinking element 4 that is electrically as well as thermally connected to the target. The keeper plate assembly 3 is made sufficiently thick that pass through magnetic flux from any of the magnet arrays described in this document is substantially inhibited. Additionally, the keeper plate is designed with intentional shape and dimension to effectuate the following phenomena: that the flux emanating from the top inner magnet array is propelled substantially perpendicular to the emanating surface as well as substantially away from the center of the magnet pack; and that the return flux from the inner magnet array be found at its highest reverse intensity at the outer edge of the keeper plate assembly. The combination of these effects will ensure the desired outcome as described above relative to the envelope of zero-crossings of the magnetic field. The field density at the outer edge of the keeper plate serves as the field confinement edge for ensuing plasmas above the cathode.

To improve the confinement capability, a magnet array 2 is placed below the keeper plate 3 such that it is found on the opposite surface with respect to the top inner magnet array 6. The lower outer magnet array 2 is maintained at or near the outer perimeter of the keeper plate 3. The lower outer magnet array 2 is opposite in magnetic polarity to the top surface inner magnet array 6. In this way, the returning magnetic flux emanating from the top surface inner magnet array 6 is focused to a substantial field intensity at the outer edge of the keeper plate assembly 3. Moreover, the fringing return field for the lower surface outer magnet array 2 is substantially away from the top surface inner array and does not constructively or destructively interact appreciably with the field emanating from the top surface inner magnet array 6.

A second lower surface (of the keeper plate assembly) inner magnet array 5 that is at a similar radius to the top surface inner magnet array is added that is parallel in magnetic polarity to the bottom surface outer magnet array 2. It is found that the presence of this bottom surface inner magnet array 5 is supportive to a high confinement field density at the outer edge of the keeper plate assembly 3.

The combination of these elements of the magnet pack design allow the propagation of magnetic field zero-crossings to be convergent about the inner portion of the cathode structure above. This promotes the enlargement of the spatial section above the cathode in which there is ionization of vapor species. To further this effect, the magnetic field is designed such that the flux emanating from the top surface inner magnetic array is substantially higher than the flux density measured at the plasma confinement edge demarcated by the keeper plate assembly (as previously described). Specifically, it is observed that the top inner magnet array 6 produces at least 150% flux intensity and more preferably 300% flux intensity measured at the plasma confinement outer edge.

Figure 3B:
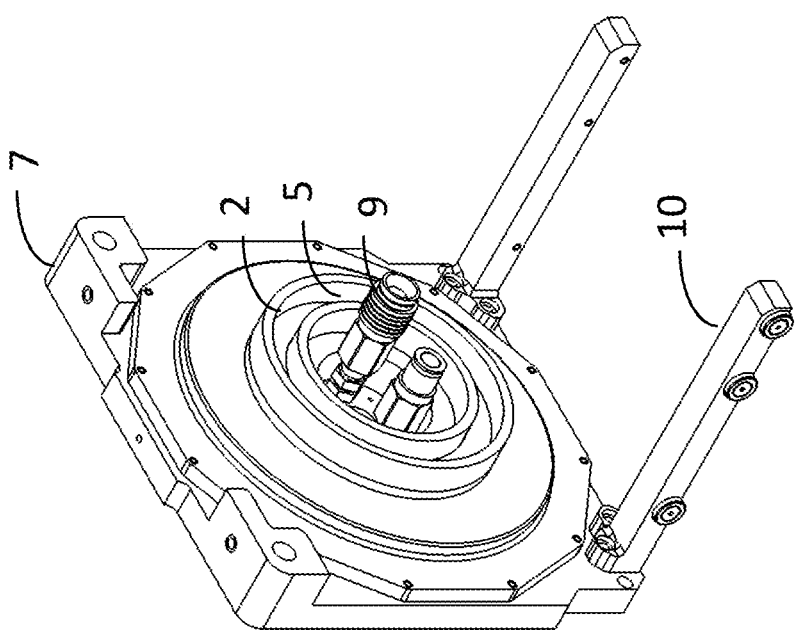
FIG. 3B a perspective view of the device of FIG. 3A.

The magnetron as deployed to facilitate the deposition of material in a vacuum environment. In FIG. 3A, the spatial relationship of individual piece parts as integrated is shown. The cathode 1 and heatsink 4 are clamped to a vacuum mounting flange 7 which is connected to a vacuum system (not shown). The material vaporized is collected by an intentional substrate 12 and chamber shield 8. On the atmospheric side of the device is a facilities water connection 9 for the supply of coolant to the heatsink. Also, in this embodiment, a wheel base 10 is attached to the outside of the structure that facilitates convenience in attaching the tool to the vacuum system. FIG. 3B is a perspective view of the device of FIG. 3A.

Figure 4B:
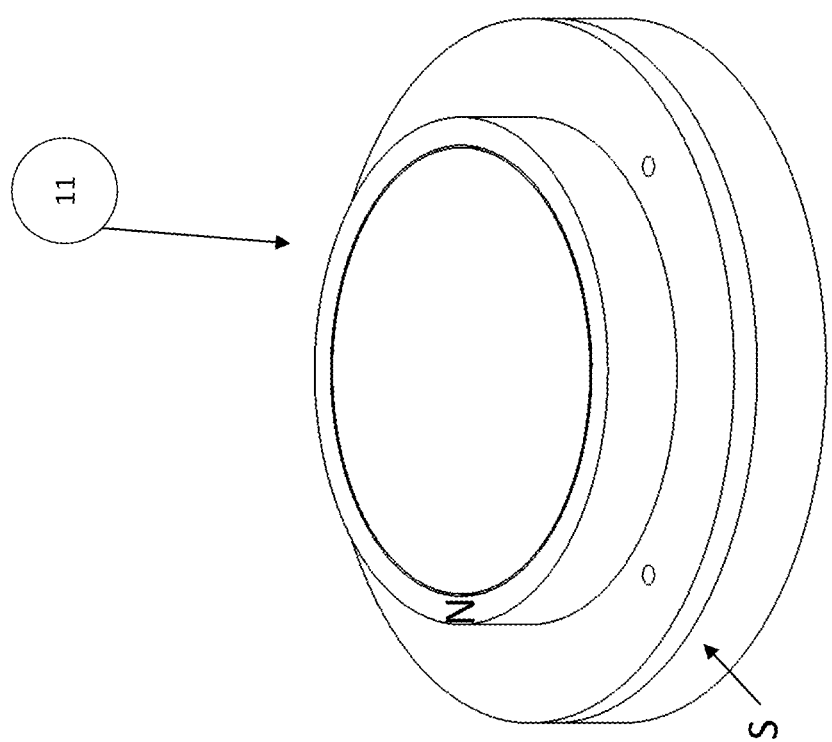
FIG. 4B is a perspective drawing of the device of FIG. 4A.

FIG. 4A illustrates keeper plate 3, lower outer magnetic array 2 and lower inner magnetic array 5. The figure also illustrates the top inner magnetic array 6. The figure also illustrates flux lines. Zero crossings are shown at the position marked 13. FIG. 4B is a perspective view of the lower outer magnetic array 2, keeper plate 3 and top inner magnetic array 6.

The disclosed technology has been applied to a magnetron where the size of the tool has called for the use of a top surface inner magnet array 6 that may be a tubular annulus magnet that facilitates the larger target size. The technology is also conducive for smaller size operation.

Figure 5:
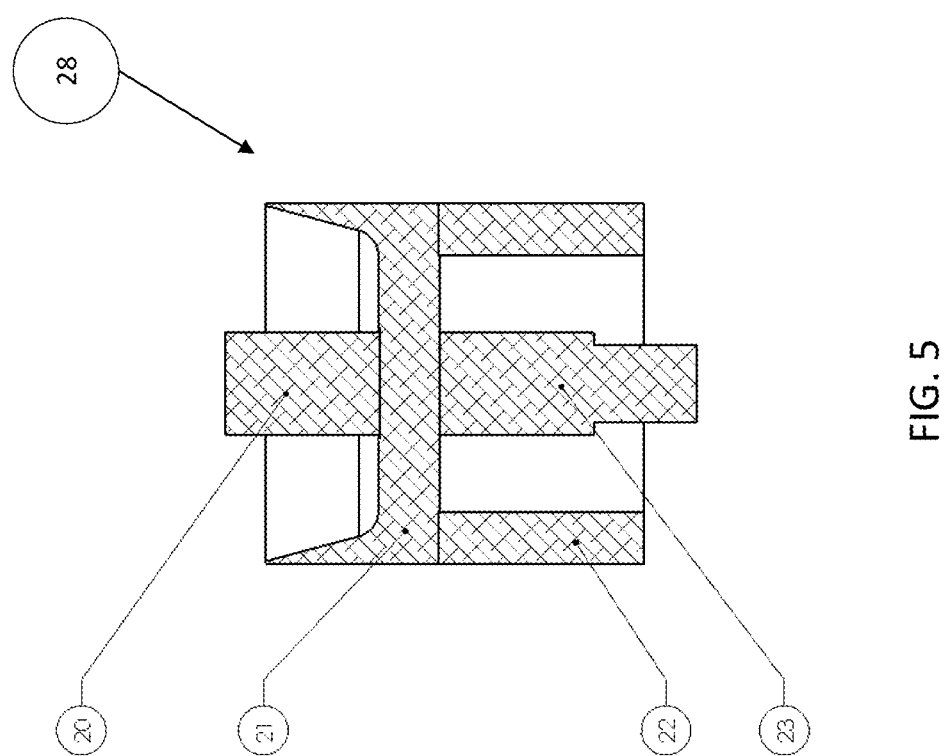
FIG. 5 is a cross sectional drawing of a similar magnet pack structure with magnet arrangement suitable for small cathode dimensions.

FIG. 5 illustrates an embodiment optimized for a smaller configuration. An inner top surface magnet 20 is placed collinear with the device centerline. The keeper plate assembly 21 is shown in this embodiment as having a tapered edge protruding from the outer edge upward. An annular magnet array 22 is connected to the bottom surface of the keeper assembly 21 and the magnetic polarity of this array 22 is opposite to the top magnet 20. As was found for the larger device, it is found to be useful to include a second magnet array (or singular magnet) 23 to the backside of the keeper 21 affixed magnetically and positioned collinearly to the centerline of the device. In this embodiment 28, we have demonstrated that a stack of magnets of decreasing radius may be used appropriately as the backside array 23.

Figure 6:
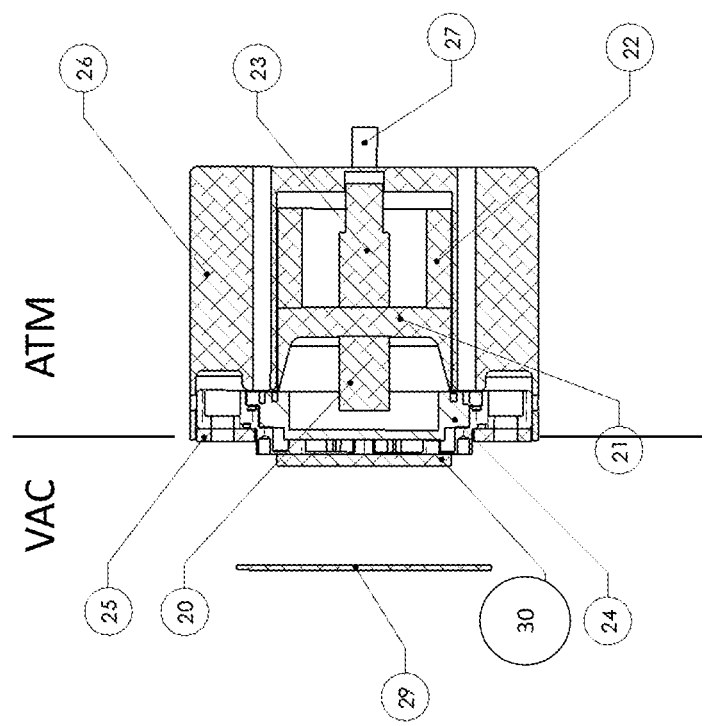
FIG. 6 is a cross sectional schematic showing the incorporation of the magnet pack within a functioning magnetron structure.

FIG. 6 shows how the embodiment 28 could be incorporated in a magnetron structure to facilitate the deposition of material in a vacuum environment. In this case, the substrate 29 is shown in relation to the cross section of the magnetron. The target 30 is attached to a heat-sinking element 24 which is supplied with coolant through a facilities nozzle 27. A clamp ring shield 25 is applied over the exposed heat-sinking element 24 that inhibits build-up of vapor material upon the element 24. An enclosure provided for safety purposes surrounds the portion of the device that is exposed to the atmospheric side of the tool and is shown as 26.

Figure 7:
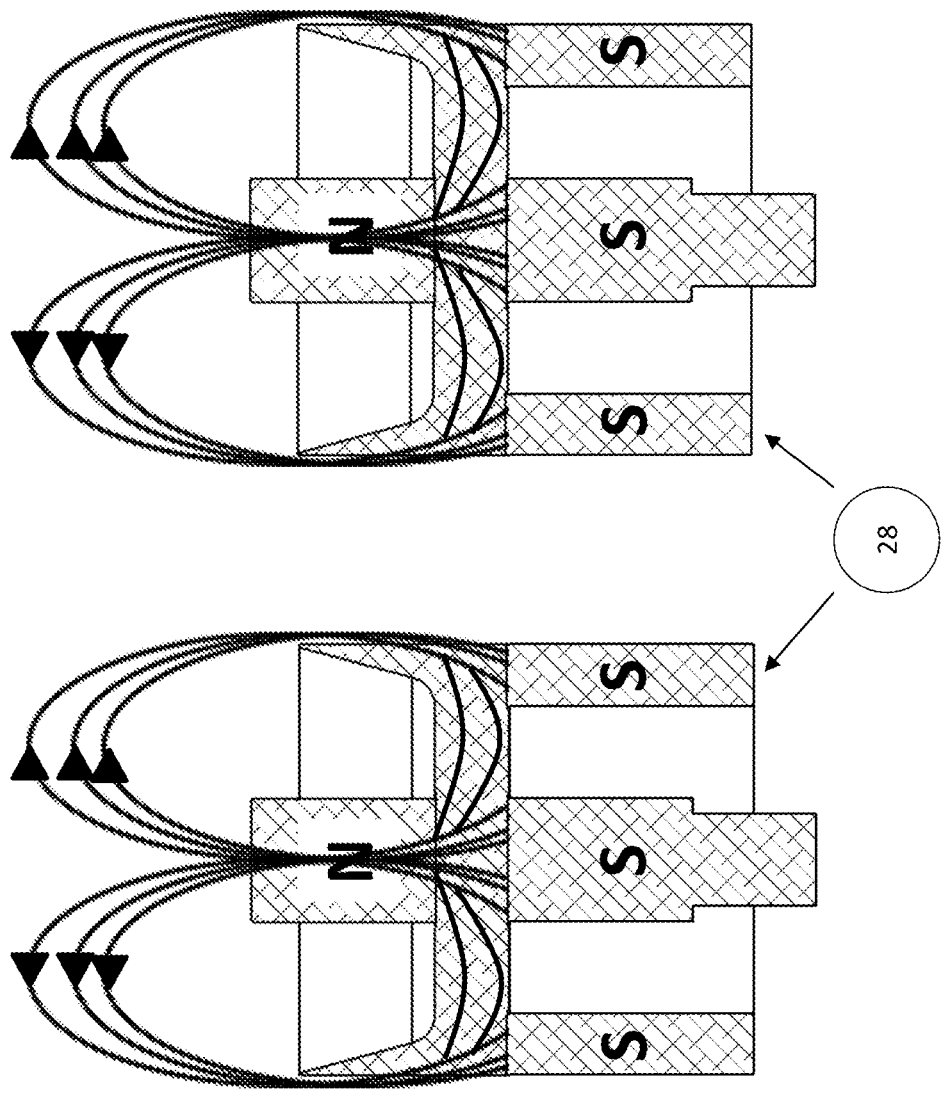
FIG. 7 is a schematic showing proximal placement of two devices and how they would maintain relative independence from a magnetic field perspective from each other.

When one such magnetron device 28 is placed directly behind a cathode assembly, it is thus observed that very low fringing field occurs beyond the perimeter of the device assembly. Therefore, it is then possible to place a plurality of such devices proximally to each other that will each define an independent plasma zone above the target. This is shown in FIG. 7. Therein, film uniformity may be tailored by judicious placement of individual magnet packs across a cathode surface.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, consisting of:
a cathode target with a cathode target outer perimeter;
an inner magnet array with an inner magnet array inner perimeter within the cathode target outer perimeter, the inner magnet array including an inner magnet array base portion positioned beneath an inner magnet array upper portion;
a keeper plate assembly connected to the inner magnet array upper portion and isolating the inner magnet array upper portion from the inner magnet array base portion, such that the inner magnet array base portion is both beneath and physically isolated from the inner magnet array upper portion, where the keeper plate assembly is magnetically permeable; and
an outer magnet array connected to a bottom surface of the keeper plate assembly, wherein the outer magnet array has an outer magnet array outer perimeter larger than the inner magnet array inner perimeter, wherein the outer magnet array is both beneath and physically isolated from the inner magnet array upper portion;
wherein the inner magnet array and outer magnet array form the sole magnetic forces in the apparatus and wherein the inner magnet array upper portion has a first magnetic orientation and the outer magnet array and the inner magnet array base portion have a second magnetic orientation opposite the first magnetic orientation to form a magnetic field environment with a return flux from the inner magnet array that has a highest reverse intensity at an outer edge of the keeper plate assembly and the return flux around the keeper plate assembly provides plasma confinement of ionizing electrons which causes a gas operative as a reactive gas and sputter gas to become ionized and subsequently directed to the cathode target.

2. The apparatus of claim 1 wherein the inner magnet array base portion produces a high confinement field density at the outer edge of the keeper plate assembly.

* * * * *